Figure 1:
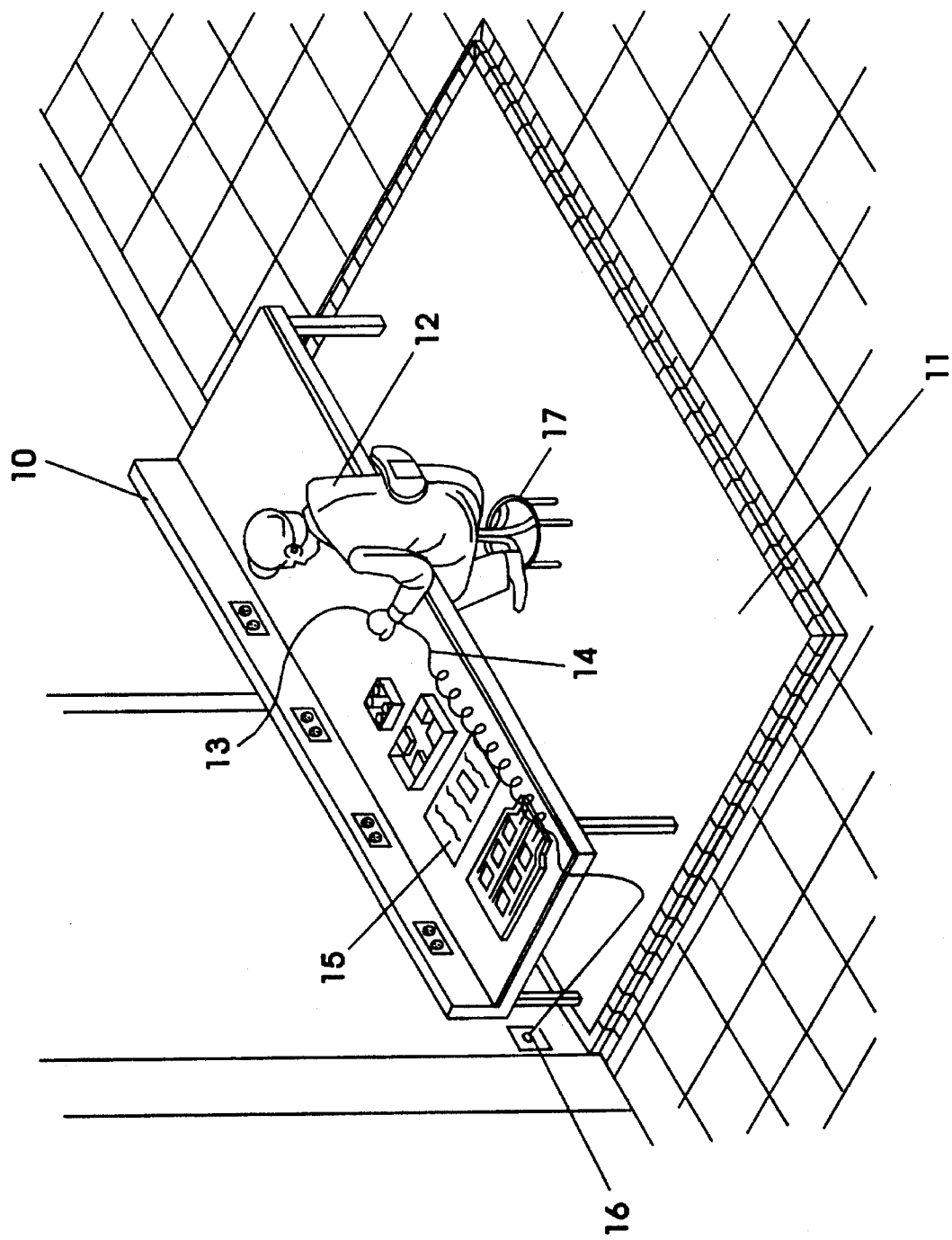

United States Patent [19]

Chanudet et al.

[11] Patent Number: 5,519,384

[45] Date of Patent: May 21, 1996

[54] SYSTEM FOR INDICATING FAULT CONDITION ON OPERATOR'S ELECTROSTATIC DISCHARGE PROTECTION EQUIPMENT

[75] Inventors: Gerard Chanudet, Juvignac; Gerard Gourdin, Castries, both of France; Jim King, Greenock, Scotland; Robert MacPherson, West Kilbridge Ayrshire, United Kingdom

[73] Assignee: International Business Machines Corporation, Armonk, N.Y.

[21] Appl. No.: 72,027

[22] Filed: Jun. 7, 1993

[51] Int. Cl.⁶ .................................................. G08B 21/00
[52] U.S. Cl. .......................... 340/649; 324/509; 324/510; 324/557; 361/90; 361/212
[58] Field of Search ........................... 340/649; 361/212, 361/220, 90; 324/509, 510, 557

[56] References Cited

U.S. PATENT DOCUMENTS

| | | | |
|---|---|---|---|
| 4,016,488 | 4/1977 | Stevens | 340/649 |
| 4,558,309 | 12/1985 | Antonevich | 340/649 |
| 4,638,399 | 1/1987 | Maroney et al. | 340/649 X |
| 4,710,751 | 12/1987 | Webster | 340/649 X |
| 4,785,294 | 11/1988 | Campbell | 340/649 |
| 4,800,374 | 1/1989 | Jacobson | 340/649 |
| 4,859,992 | 8/1989 | Hoigaard | 340/649 |
| 5,218,306 | 6/1993 | Bakhoum | 340/649 X |

OTHER PUBLICATIONS

H330, Burich et al; Sep. 1, 1987 (Statutory Invention Registration).

*Primary Examiner*—John K. Peng
*Assistant Examiner*—Edward Lefkowitz
*Attorney, Agent, or Firm*—Joscelyn G. Cockburn

[57] ABSTRACT

A system for indicating fault condition on operator's electrostatic discharge protection equipment includes for an operator wearing ESD protection equipment comprising: a conductive wrist-strap in electrical contact with the operator's body, and an electrical wiring to a local ground, a portable system to alert the operator when a problem (cut or poor electrical connection) occurs with wiring to the ground, or when an electrical field reaches a predetermined value at the operator's wrist.

In one embodiment, the invention also includes a device for memorizing that an ESD event has occurred.

9 Claims, 2 Drawing Sheets

SYSTEM FOR INDICATING FAULT CONDITION ON OPERATOR'S ELECTROSTATIC DISCHARGE PROTECTION EQUIPMENT

The present invention relates to ElectroStatic Discharge (ESD) protection equipment, and more particularly to a system for indicating fault condition on such an equipment.

Electronic components are nowadays less sensitive to ESD than what they once were: this is mainly due to emerging new technologies and peculiar on-chip design techniques.

However, the need for taking special precautions when manipulating such components has not quite disappeared: operators still need to wear or use special equipment (conductive shoes, bracelet, etc . . . ), or a workstation itself requires specific adaptation (conductive floor, mats, seats, grounded instruments, etc . . . ).

Amongst the above mentioned precautions, one consists in having operators wear a conductive bracelet connected to the local ground, so that they are prevented from charging themselves at an electrical potential which could be harmful to the manipulated electronic components. The concept is very well-known in the prior art.

One of the problems associated with that concept however, is the fact that the conductive path between the operator's wrist and the ground may be affected: the wiring may be cut or damaged, or the electrical contact between the operator's wrist and the bracelet rended more resistive due to oxidization. All of this without the operator noticing it, in which case charges might accumulate and several components be destroyed before the default condition is even detected.

It is therefore an object of the present invention to provide a system for indicating fault condition on operator's electrostatic discharge protection equipment.

It is a further object of the present invention to provide a system continuously monitoring continuity of the electrical path between an operator wearing a personal ESD protection equipment and the ground.

It is yet a further object of the invention to provide a portable system for detecting the presence of an electrostatic field reaching a predetermined value.

It is a yet a further object of the invention to provide such a system which alerts the operator when such a value has been reached.

It is yet a further object of the invention to provide such a system which memorizes that an ESD event has occurred and that lastly manipulated components may have been damaged.

The invention includes for an operator wearing ESD protection equipment comprising: a conductive wrist-strap in electrical contact with the operator's body, and an electrical wiring to a local ground, a portable system to alert the operator when a problem (cut or poor electrical connection) occurs with wiring to the ground, or when an electrical field reaches a predetermined value at the operator's wrist.

In one embodiment, the invention also includes a device for memorizing that an ESD event has occurred.

The invention more specifically includes a system for indicating fault condition on operator's electrostatic discharge protection equipment comprising: a conductive wrist-strap in electrical contact with the operator's body, and an electrical wiring to a local ground, said system also comprising: means inserted and electrically in series between the wiring and the wrist-strap for detecting when resistance from the operator's body to the ground exceeds a first predetermined value, and means responsive to said means in series for activating first warning signals stimulating the operator's senses.

The invention will be better understood from the following detailed description read in conjunction with the following schematics:

FIG. 1 being a representation of a workstation where the invention is made operational.

Figure 2:
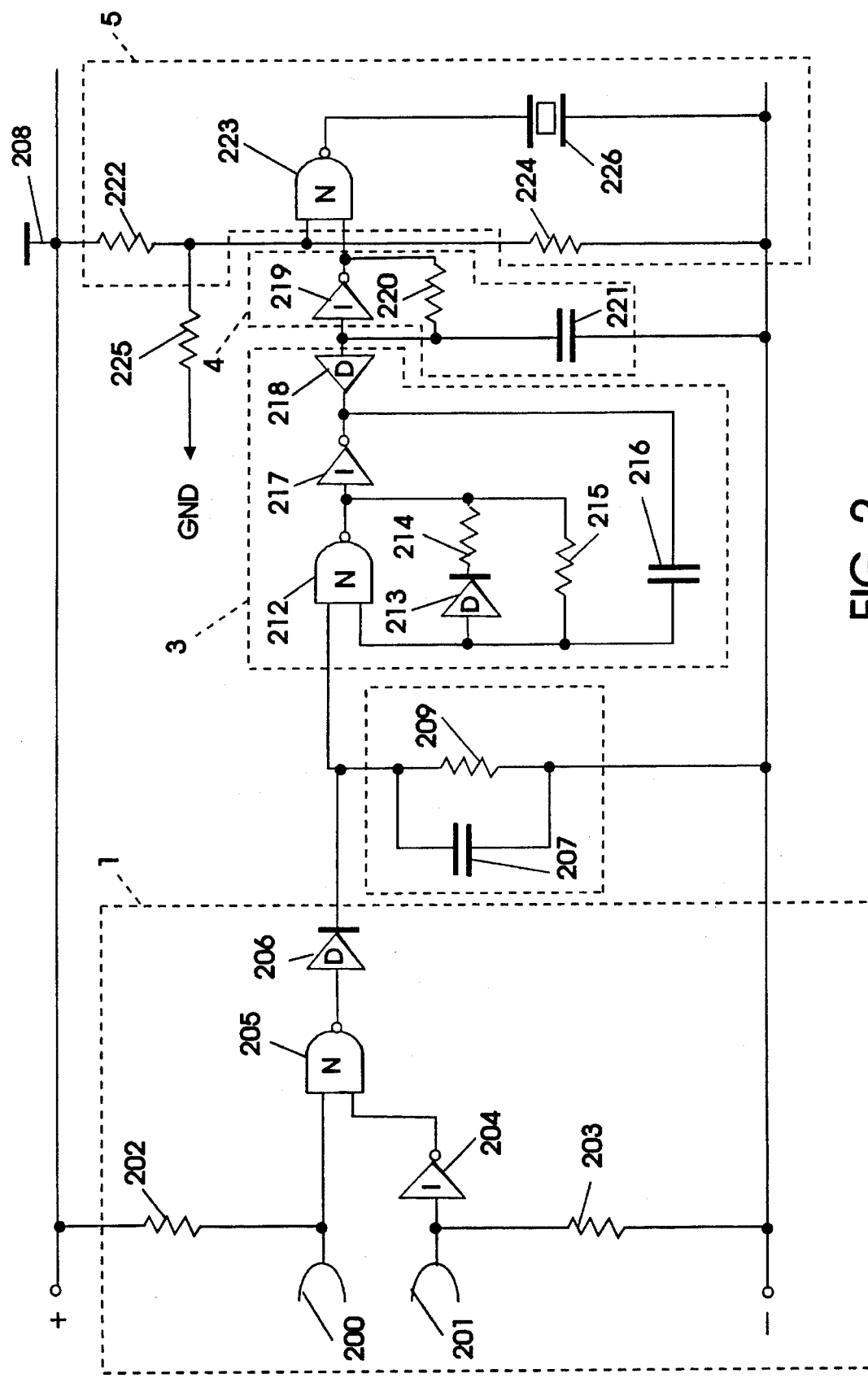

FIG. 2 being a schematic of the electronics of the system of the invention.

FIG. 1 is a representation of a workstation where the invention is made operational. It generally includes a table 10, on which are laid electronic components or cards 15 that an operator 12 is testing or somehow manipulating.

Precautions against ESD include a conductive floor 11, and a conductive bracelet 13 connected to the local ground through wiring 14 and outlet 16 in the wall. Other precautions consist in conductive shoes for the operator, as well as a conductive chair 17 so as to contribute to an ESD protected environment.

The invention adds to the conductive bracelet a system housed in a convenient small size case, such as a watch case, in a way well-known to the man skilled in the art.

FIG. 2 is a schematic of the electronics of the system of the invention. All components are standard components, the only requirement being that they should be of sufficient small size so as to all fit within a packaging the size of which has already been mentioned. Assembly of such components on a small printed circuit is also well within the scope of knowledge of the man skilled in the art, and will therefore not be emphasized here.

The whole circuitry is for example powered by a portable battery connected between '+' and '−' leads, whether it be chargeable or not. In the case it is chargeable, solar devices coupled to a charging mechanism can be placed respectively on top and within the case in which the system of the invention is packaged.

A switch (not shown) placed beneath the case on the wrist-strap side, and triggered when the bracelet is put on or taken off by the operator, may allow to save battery energy by powering-on the electronics only when the system is actually worn.

Circuitry comprises five main parts:

A first part is composed of conductive plates 200 and 201, resistors 202 and 203, inverter 204, hand gate 205 and diode 206.

This part acts as an electrical field detector with conductive plates as sensors.

Plate 200 is connected to resistor 202 and a first input of nand gate 205, while plate 201 is connected to resistor 203, and the second input of nand gate 205 thru the inverter 204. The other input of both resistors is connected respectively to the '+' and '−' leads. Diode 206 connected to the output of nand gate 205 allows charging the next circuitry part.

The conductive plates are electrically isolated from any other part so as to form an electrical field sensitive device. They can be semi-circular plates mounted either inside or outside the case in which the system of the invention is packaged.

The resistor value is within a range of several hundreds MOhms. This value determines the device sensitivity and the threshold for the electrical field for which output of diode 206 becomes activated. Reverse biased diodes (such as well-known 1N4148) could also be used in place of the resistors, in a manner well-known to the man skilled in the art.

Diode 206 can also be of the 1N4148 type.

A second part is composed of capacitor 207 and resistor 209 in parallel between the output of diode 206 and '−' lead. The time constant of this RC allows to memorize for several seconds a pulse indication from the previous circuitry part that an electrical field value has been reached.

Values for capacitor 207 and resistor 209 can respectively be 470 nF and 7.5 MOhms for a time constant of around 3 seconds.

A third part is composed of nand gate 212, inverter 217, capacitor 216, resistors 214 and 215, as well as diodes 213 and 218. This part acts as a pulse generator.

Output of circuitry first part is connected to a first input of nand gate 212, its second input being fed back by a loop composed of: a group of diode 213 in series with resistor 214, this group being in parallel with resistor 215. Output of nand gate 212 inputs inverter 217. Output of inverter 217 is connected to capacitor 216, its other end being also fed back into the second input of nand gate 212, and also to the negative polarity side of diode 218.

Implemented values for components include 47 kOhms and 470 kOhms for respectively resistors 214 and 215, and 470 nF for capacitor 216. Diodes 213 and 218 can be of the 1N4148 type.

A fourth part is composed of inverter 219, resistor 220 and capacitor 221. It acts as an oscillator at a frequency in the range of a few kHz.

The output of circuitry previous stage (output of diode 218) is fed into the input of inverter 219 as well as a first input of resistor 220 and capacitor 221. The other input of resistor 220 is connected to the output of inverter 219, forming another feedback loop, while the other input of capacitor 221 is connected to '−' lead.

Values for components include 43 kOhms for resistor 220, and 100 nF for capacitor 221.

A fifth and last part is composed of nand gate 223, resistors 222, 224 and transducer 226. This last part acts as a continuity monitor.

The output of previous circuitry stage (output of inverter 219) is fed into a first input of nand gate 223. A second input is connected to an input of resistors 222 and 224 forming a voltage dividing bridge between '+' and '−' polarities, and a resistor 225. Resistor 225 is the resistor usually in series for safety reasons with the wiring from the operator's wrist to the ground. Nand gate 223 feeds transducer 226.

The '+' lead is in electrical contact with the operator's wrist thru a conductive plate 208 which is for example mounted beneath the case in which the system of the invention is packaged. When a problem arises in the wiring continuity to the ground, potential rises at the second input of nand 223 which becomes activated and turns on buzzer 226. A pulsed signal at the oscillator frequency can be heard by the operator. The ratio for values of resistors 225, 222 and 224 determines the threshold of resistance of the electrical path to the ground from which the system triggers.

The transducer can be a known piezo electric audio transducer. Small size and power consumption are the only requirements for such a device. Values for components include 70 MOhms to 97 MOhms for resistor 222, and 40 MOhms for resistor 224.

Therefore, with the described system, when a problem (cut or poor electrical connection) occurs with wiring to the ground, or when an electrical field reaches a predetermined value at the operator's wrist, buzzer 226 alerts the operator who can take immediate actions to prevent manipulated components to be damaged.

A system which can solely act as a continuity monitor, or solely as an electrical field detector is also contemplated. In the first case, only the fourth and fifth parts of the electronics circuitry are kept, and in the second case, part five may be adjusted in a way familiar to the man skilled in the art.

Another feature consists in adding to the system of the invention, a device for memorizing that an ESD event has occurred. When an operator builds up a charge and is wearing such an ESD event device, the device is being charged at the same potential as the operator. When he touches ground or any component or part which has a path to ground, the device indicates failure for example by changing color. The device can be reset to original color by applying an external signal. The device can be either attached with the wrist-strap or embedded in the case in which the system of the present invention is packaged.

The electronics for such a device is well-known to the man skilled in the art, and can for example be found in the ESD Event Detection System of the Zero Static Systems Company having headquarters in the State of California, USA.

Feasibility and reliability such a feature was proven by: electrically isolating an operator, charging him up over a range of voltages, calibrating the worn device at trigger voltages of 34 V and 87 V respectively for a certain value of capacitance, then determining at what electrostatic voltage the device actually triggered, and repeating the process with several successive operators.

It was concluded that the device calibrated at 34 V was capable of consistently trigger at 850 V and above, and the system calibrated at 87 V was capable of consistently trigger at 1350 V and above.

Although the invention has been described in a particular embodiment, it will be obvious to the man skilled in the art, that the description is sufficient to allow easy adaptation of the invention to different electrical field conditions, system packaging and component values.

We claim:

1. A system for continuously monitoring and indicating fault condition on operator's electrostatic discharge protection equipment comprising:

a conductive wrist-strap (13) in electrical contact with an operator's body;

an electrical wiring (14) to a local ground;

a resistive means, disposed between the wrist-strap and a reference voltage, for establishing a first predetermined voltage value;

means (225, 222, 208) inserted and electrically in series between the electrical wiring and the conductive wrist-strap for generating an error signal when resistance from the operator's body to the ground exceeds the first predetermined voltage value, means including an oscillator (219, 220, 221) for generating a pulse train having a predetermined frequency;

NAND gate 223, responsive to said error signal and the pulse train for generating activating signals;

means responsive to the activating signals to issue warning signals stimulating the operator's senses; and an electrical field detector (200 to 207, 208) for detecting that the electrical field at the operator's wrist exceeds a second predetermined value with said electrical field detector outputting an electrical field signal and means (212 to 218), responsive to said electrical field signal, for generating pulses which are supplied to the oscillator.

2. The system of claim 1 wherein the oscillator has an inverter;

a first resistor interconnecting an output of the inverter to its input; and a capacitor interconnecting the input to the reference voltage.

3. The system of claim 2 wherein the means responsive to the activating signal includes a piezo electric audio transducer.

4. The system according to claim 2, characterized in that it also comprises means for memorizing that an electrostatic discharge event has occurred.

5. The system according to claim 2, characterized in that it is packaged in a watch-type case attached to said wrist-strap.

6. The system according to claim 5, characterized in that it also comprises a power-on switch activated only when said wrist-strap is worn by the operator.

7. The system of claim 1 wherein the resistive means for establishing the first predetermined voltage value includes a first resistor (222) connected in series with a second resistor (224) and said first resistor and said second resistor being connected across a positive and a negative voltage level; and a battery for providing the positive and negative voltage levels.

8. The system according to claim 7, characterized in that said battery is a chargeable battery.

9. The system of claim 1 wherein the means inserted and electrically in series includes a conductive plate (208); a first resistor (222) connected to the conductive plate and a second resistor 225 connected to the first resistor.

* * * * *